United States Patent
Hamasaki et al.

[11] Patent Number: 5,815,051
[45] Date of Patent: Sep. 29, 1998

[54] DIFFERENTIAL FILTER CIRCUIT AND INTEGRATED CIRCUIT STRUCTURE THEREFOR

[75] Inventors: Toshihiko Hamasaki, Yokohama; Hitoshi Terasawa, Tokyo; Toshio Murota, Kanagawa, all of Japan

[73] Assignee: Burr-Brown Corporation, Tucson, Ariz.

[21] Appl. No.: 718,918

[22] Filed: Sep. 25, 1996

[30] Foreign Application Priority Data

Sep. 29, 1995 [JP] Japan ................................. 7-253689

[51] Int. Cl.⁶ ............................. H03H 1/02; H03H 7/06
[52] U.S. Cl. ........................... 333/172; 333/184; 333/185; 257/533
[58] Field of Search .................................. 333/172, 175, 333/181, 184, 185; 257/533

[56] References Cited

U.S. PATENT DOCUMENTS

| | | | |
|---|---|---|---|
| 4,553,050 | 11/1985 | Feinberg et al. | 257/533 X |
| 4,641,165 | 2/1987 | Iizuka et al. | 257/533 X |
| 4,994,693 | 2/1991 | Popescu | 333/172 X |
| 5,179,362 | 1/1993 | Okochi et al. | 333/181 |
| 5,420,553 | 5/1995 | Sakamoto et al. | 333/172 |

FOREIGN PATENT DOCUMENTS

| | | | |
|---|---|---|---|
| 274347 | 7/1988 | European Pat. Off. | 333/181 |
| 62-76762 | 4/1987 | Japan | 257/533 |

OTHER PUBLICATIONS

Logemann, Jr. "High Pass Filter and Switch Circuit for Eliminating Spurious Components from a Television Video Signal as used in an Automatic Data Processing System," Technical Notes, RCA, TN No.: 994, pp. 1–2, Jan. 1975.

Detailed circuit diagram of a filter circuit included in the PCM1710U shown on the data sheet submitted as prior art on Jan. 23, 1997.

Data Sheet for the PCM1710U Dual Voltage Output CMOS Delta–sigma DAC with On–Chip Filter, Burr–Brown Japan, Ltd., Apr., 1994, pp. 1–16.

*Primary Examiner*—Robert J. Pascal
*Assistant Examiner*—Justin P. Bettendorf
*Attorney, Agent, or Firm*—Cahill, Sutton & Thomas P.L.C.

[57] ABSTRACT

Differential filters for removing both normal-mode and common-mode noises are provided. A first-order differential low pass filter is composed of a first resistor connected between a first input terminal and a first output terminal, a second resistor having the same resistance value as the first resistor and connected between a second input terminal and a second output terminal, a first capacitor connected between the first output terminal and a reference potential, a second capacitor having the same capacitance value as the first capacitor and connected between the second output terminal and the reference potential, and a third capacitor connected between the first output terminal and the second output terminal.

18 Claims, 15 Drawing Sheets

DIFFERENTIAL FILTER CIRCUIT AND INTEGRATED CIRCUIT STRUCTURE THEREFOR

BACKGROUND OF THE INVENTION

1. Field of the Invention

The present invention relates to differential filter circuits and an integrated circuit structure for such a differential filter circuit, and more particularly to a differential filter circuit which is suitably implemented in the form of an integrated circuit and includes a differential RC low pass filter and a differential RC high pass filter.

2. Description of the Related Art

For designing a filter as a component of a circuit having a highly accurate, low noise analog performance on a semiconductor integrated circuit, the circuit must be designed in consideration of a filter function for removing noise, in addition to desired filter characteristics. Conventionally, a differential configuration has generally been used to remove, for example, normal noise. For common-mode noise, on the other hand, an active filter using a RC circuit and an operational amplifier is designed such that the operational amplifier has a high common-mode removing ratio to solve possible problems associated with common-mode noise.

However, such an active filter tends to have a relatively large circuit scale because the constituent operational amplifier is implemented in a cascade configuration. Further, since low supply voltages are commonly used in semiconductor integrated circuits manufactured by the recent semiconductor integrated circuit processes, it is extremely difficult to design an amplifier with a high common mode removing ratio, thus presenting difficulties in achieving highly integrated circuits intended to provide a highly accurate, low noise analog performance.

SUMMARY OF THE INVENTION

The present invention has been proposed to overcome the problem of implementing favorable analog circuits on semiconductor integrated circuits manufactured by the recent ultra-miniturization processes, which problem has been regarded difficult for the conventional filter design to solve.

It is thus an object of the present invention to provide a differential filter circuit having favorable filtering effects for both normal-mode and common-mode noises.

It is another object of the present invention to provide a differential filter having favorable filtering effects for both normal-mode and common-mode noises and effectively formable on a small chip area.

Briefly described, and in accordance with one embodiment thereof, the invention provides a first-order differential low pass filter circuit including a first resistor exclusively connected between a first input terminal and a first output terminal, a second resistor having the same resistance value as the first resistor exclusively connected between a second input terminal and a second output terminal, a first capacitor connected between the first output terminal and a reference potential, a second capacitor having the same capacitance value as the first capacitor and connected between the second output terminal and the reference potential, and a third capacitor connected between the first output terminal and the second output terminal. In one embodiment, the filter circuit is implemented as an integrated circuit structure including a first insulating layer, a first electrode formed to be in contact with a first surface of the first insulating layer, and a second electrode and a third electrode formed on an opposite second surface of the first insulating layer at positions opposite to the first electrode. A fourth electrode and a fifth electrode are formed at positions opposite to the second electrode and the third electrode, respectively, on a second insulating layer. A first resistor and a second resistor are formed on the second surface of the first insulating layer. A first conductor connects the first electrode to a reference potential, a second conductor connects a first end of the first resistor to the second electrode, a third conductor connects a first end of the second resistor to the third electrode, a fourth conductor connects the second electrode to the fifth electrode, and a fifth conductor connects the third electrode to the fourth electrode. A first input terminal is connected to a second end of the first resistor and a second input terminal is connected to a second end of the second resistor, respectively. First and second output terminals are connected to the fourth electrode and the fifth electrode, respectively. The first electrode and the second electrode form a first capacitor, the first electrode and the third electrode form a second capacitor, the second electrode and the fourth electrode form one capacitor constituting a third capacitor and the third electrode and the fifth electrode form the other capacitor constituting the third electrode. The first and second resistors and the first, second and third capacitors constitute a first-order differential low pass filter.

DESCRIPTION OF THE PREFERRED EMBODIMENTS

Figure 1:
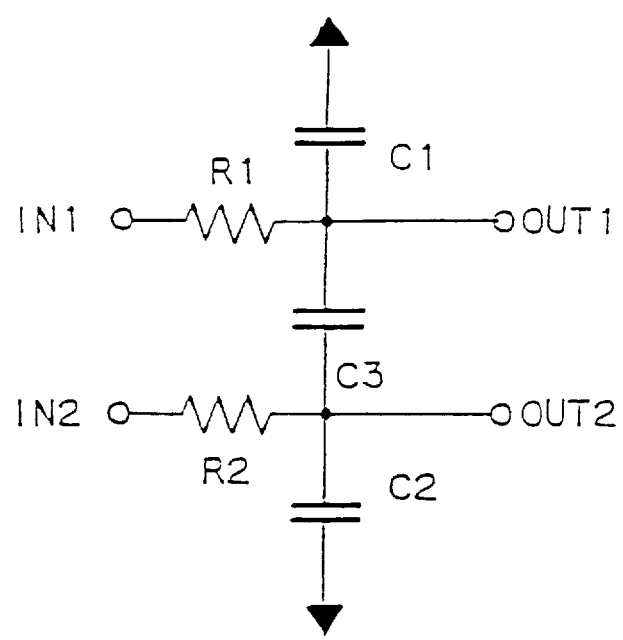
FIG. 1 is a schematic circuit diagram illustrating the configuration of a first-order differential low pass filter circuit, which is a first embodiment of a differential filter circuit according to the present invention.

Several embodiments of the present invention will hereinafter be described in detail with reference to FIGS. 1–16, wherein identical components in different drawings are designated by the same reference numerals and symbols.

FIG. 1 schematically illustrates the configuration of a first-order differential low pass filter, which is a first embodiment of a differential filter circuit according to the present invention. Referring specifically to FIG. 1, a first input terminal IN1 is connected to one end of a first resistor R1, while a second input terminal IN2 is connected to one end of a second resistor R2. The first resistor R1 and the second resistor R2 have the same resistance value. The other end of the first resistor R1 is connected to a first output terminal OUT1 as well as is grounded or connected to a power supply through a first capacitor C1. The other end of the second resistor R2 is connected to a second output terminal OUT2 as well as is grounded or connected to a power supply through a second capacitor C2. The first capacitor C1 and the second capacitor C2 have the same capacitance value. Further, a third capacitor C3 is connected between the other end of the first resistor R1 and the other end of the second resistor R2.

Figure 2:
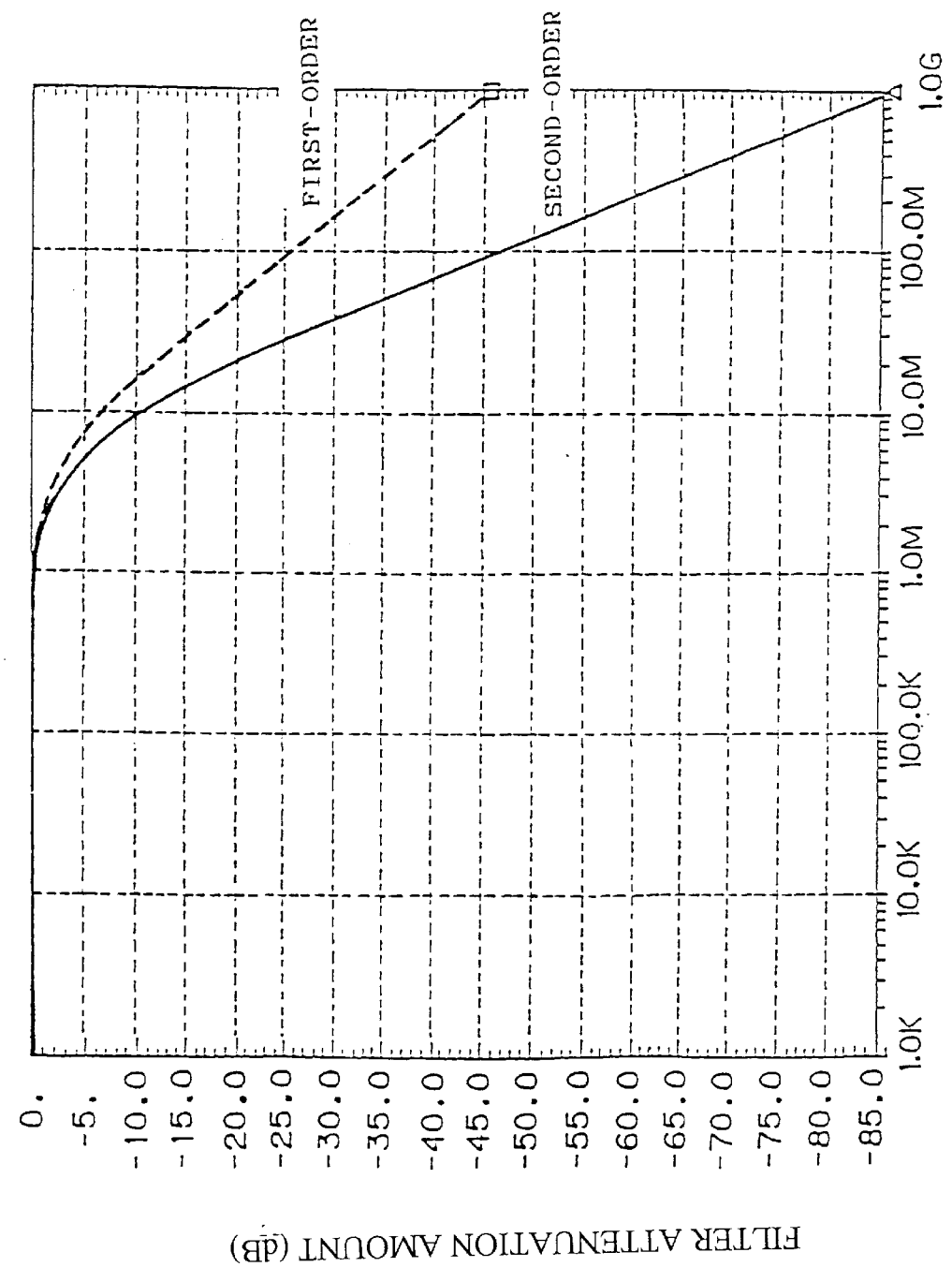
FIG. 2 is a graph for explaining frequency characteristics of differential low pass filter circuits illustrated in FIGS. 1 and 13.
Figure 3:
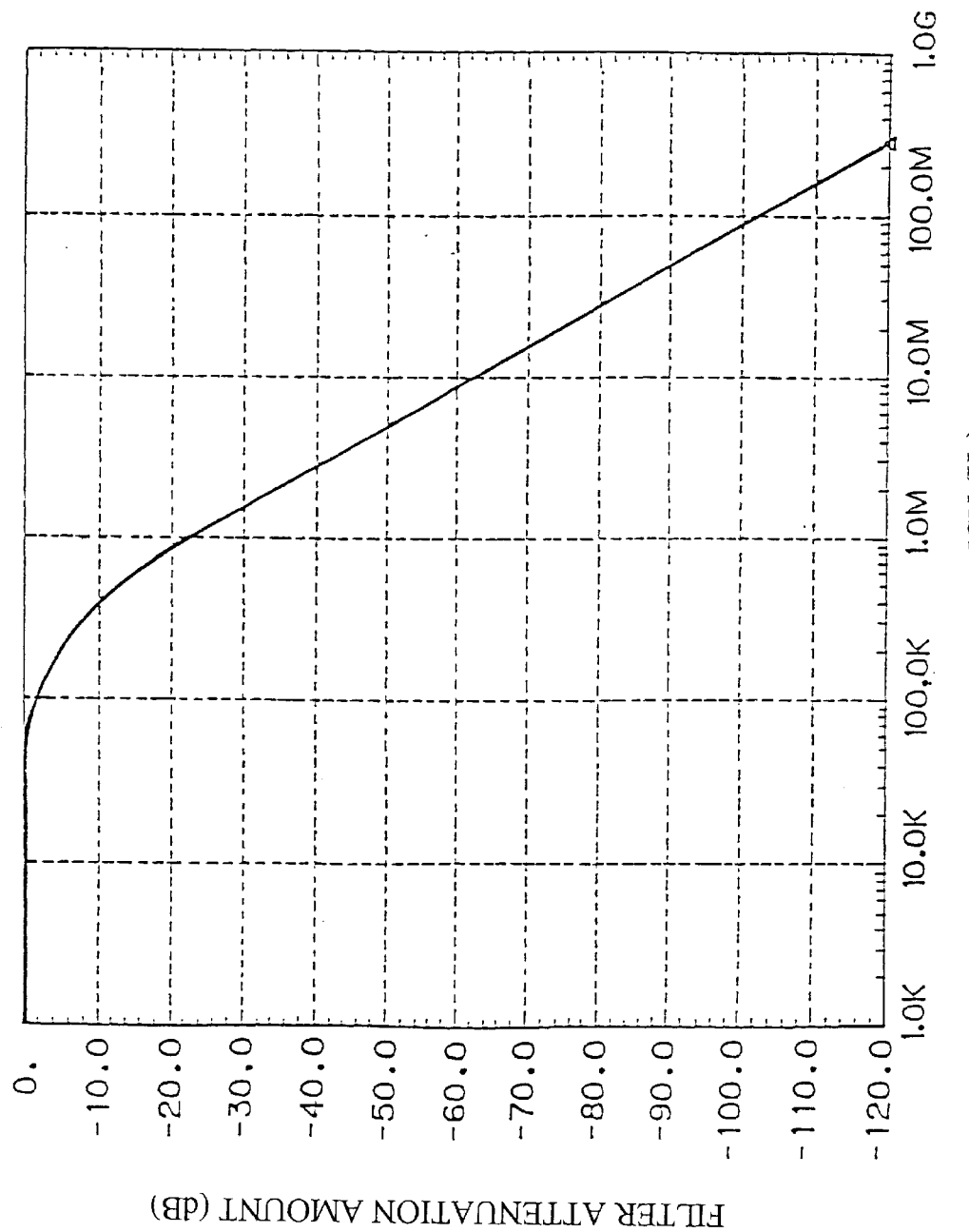
FIG. 3 is a graph for explaining a frequency characteristic of the differential low pass filter illustrated in FIG. 1.

In the configuration as described above, the first resistor R1, the second resistor R2 and the third capacitor C3 constitute a low pass filter for removing normal-mode noise. Also, the first resistor R1 and the first capacitor C1 constitute a low pass filter for removing common-mode noise possibly occurring on the positive phase side, while the second resistor R2 and the second capacitor C2 constitute a low pass filter for removing common-mode noise possibly occurring on the negative phase side. A dotted line curve shown in FIG. 2 represents a characteristic of the low pass filter constituted of the first capacitor C1 and the first resistor R1 for removing common-mode noise. A solid line curve shown in FIG. 3 represents a characteristic of the low pass filter constituted of the first resistor R1, the second resistor R2 and the third capacitor C3 for removing normal-mode noise.

Figure 4:
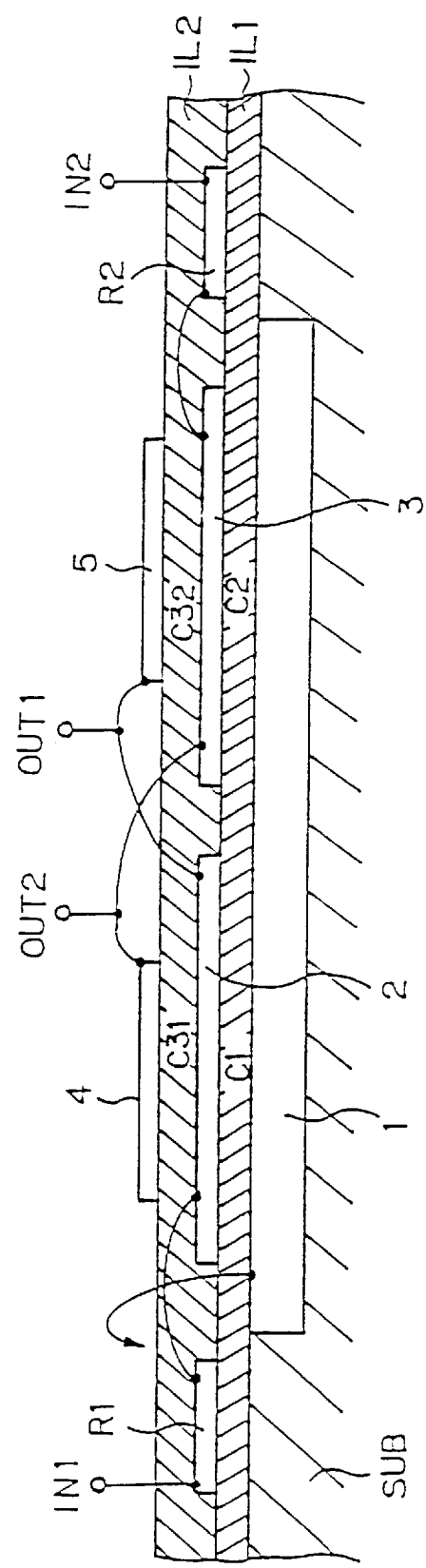
FIG. 4 is a cross-sectional view for explaining an example of an integrated circuit structure constituting the differential low pass filter circuit of FIG. 1.

Next, an integrated circuit structure for implementing the differential low pass filter circuit of FIG. 1 will be explained in connection with several examples. FIG. 4 schematically illustrates an example of an integrated circuit structure of the type mentioned above. Referring specifically to FIG. 4, an N-type diffusion layer is formed on a surface of a semiconductor substrate SUB made of P-type silicon to provide a first electrode 1. A first insulating layer IL1 is formed overlying the first electrode 1, and then a second electrode 2 and a third electrode 3 are formed on the first insulating layer IL1. Further, the first resistor R1 and the second resistor R2 are formed outside of the second and third electrodes 2, 3, respectively. After a second insulating layer IL2 is formed to cover the second electrode 2, the third electrode 3, the first resistor R1 and the second resistor R2, a fourth electrode 4 is formed on the second insulating layer IL2 at a position opposite to the second electrode 2, and a fifth electrode 5 is formed also on the second insulating layer IL2 at a position opposite to the third electrode 3.

Preferably, for example, a material suitable for the first insulating layer IL1 and the second insulating layer IL2 is $SiO_2$, a material suitable for the second electrode 2 and the third electrode 3 is first polycrystalline silicon, a material suitable for the fourth electrode 4 and the fifth electrode 5 is second polycrystalline silicon which is different from the first polycrystalline silicon, and a material suitable for the first resistor R1 and the second resistor R2 is the first polycrystalline silicon or the second polycrystalline silicon.

The first insulating layer IL1 is approximately 5000 Angstroms thick, the second insulating layer IL2 is approximately 500 Angstroms thick, and the second electrode 2, the third electrode 3, the first resistor R1, the second resistor R2, the fourth electrode 4 and the fifth electrode 5 are all 5000 Angstroms thick. It is to be understood that the above specific values are mere examples and the above-mentioned components are not limited to these values.

Thus, the first capacitor C1 is formed between the first electrode 1 and the second electrode 2, and the second capacitor C2 is formed between the first electrode 1 and the third electrode 3. Also, a capacitor C31 is formed between the second electrode 2 and the fourth electrode 4, and another capacitor C32 is formed between the third electrode 3 and the fifth electrode 5. The capacitors C31, C32 are connected in parallel between the first output terminal OUT1 and the second output terminal OUT2, where the combined capacitance value of the parallelly connected capacitors C31, C32 is equal to the capacitance value of the third capacitor C3.

The one end of the first resistor R1 is connected to an input terminal IN1 and is connected to a second electrode 2. The second electrode 2 is connected to the fifth electrode 5, and the third electrode 3 is connected to the fourth electrode 4 as well as to one end of the second resistor R2. The other end of the second resistor R2 is connected to the second input terminal IN2. For these connections, a conductive metal material is used.

As will be understood from the foregoing, the second electrode 2 and the third electrode 3 are shared to form a plurality of capacitors, so that the resulting low pass filters can be formed in an extremely small area.

Figure 5:
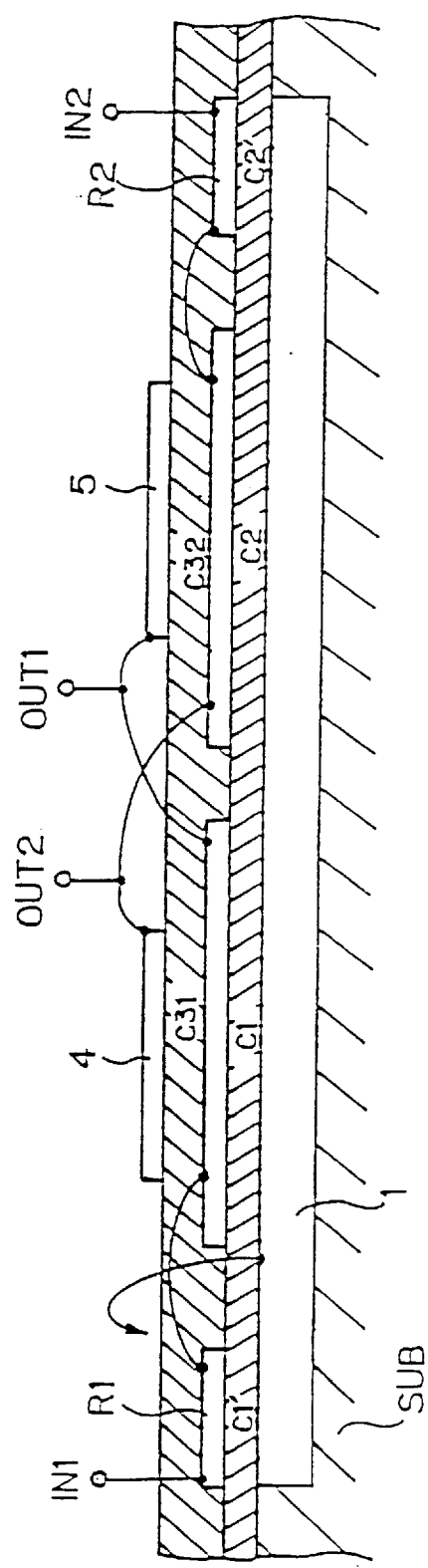
FIG. 5 is a cross-sectional view illustrating a modified example of the integrated circuit structure depicted in FIG. 4.
Figure 6:
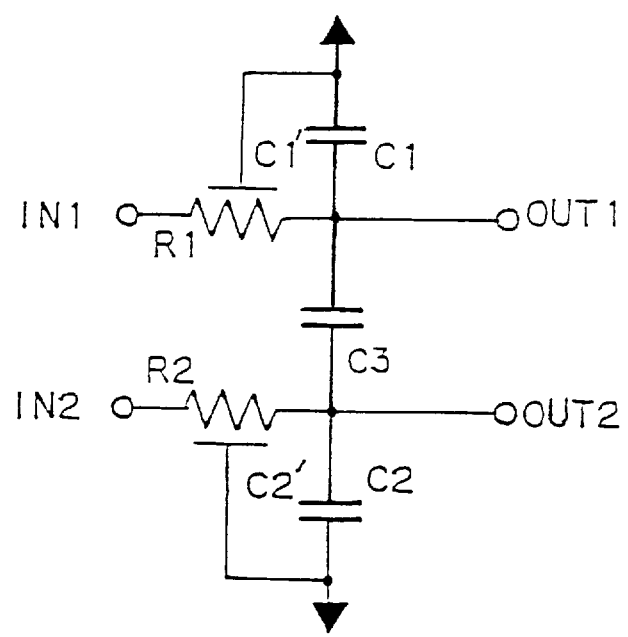
FIG. 6 is a circuit diagram representing an equivalent circuit for the integrated circuit structure shown in FIG. 5.

FIG. 5 shows a modified example of the integrated circuit configuration depicted in FIG. 4. Specifically, the modification is made to extend the first electrode 1 so as to overlap with the first resistor R1 and the second resistor R2. With this configuration, an additional capacitor C1' is formed between the first electrode 1 and the first resistor R1, and another additional capacitor C2' is formed between the first electrode 1 and the second resistor R2. An equivalent circuit for the integrated circuit configuration illustrated in FIG. 5 is represented in FIG. 6. As is apparent from the equivalent circuit, the capacitor C1' is connected in parallel with the first capacitor C1, while the capacitor C2' is connected in parallel with the second capacitor C2, so that the first capacitor C1 and the second capacitor C2 can be formed in a smaller area. In addition, since the first capacitor C1 can be adjusted by the capacitor C1' and the second capacitor C2 by the capacitor C2', it is possible to enhance the common mode noise removing capability of the overall circuit.

Figure 7:
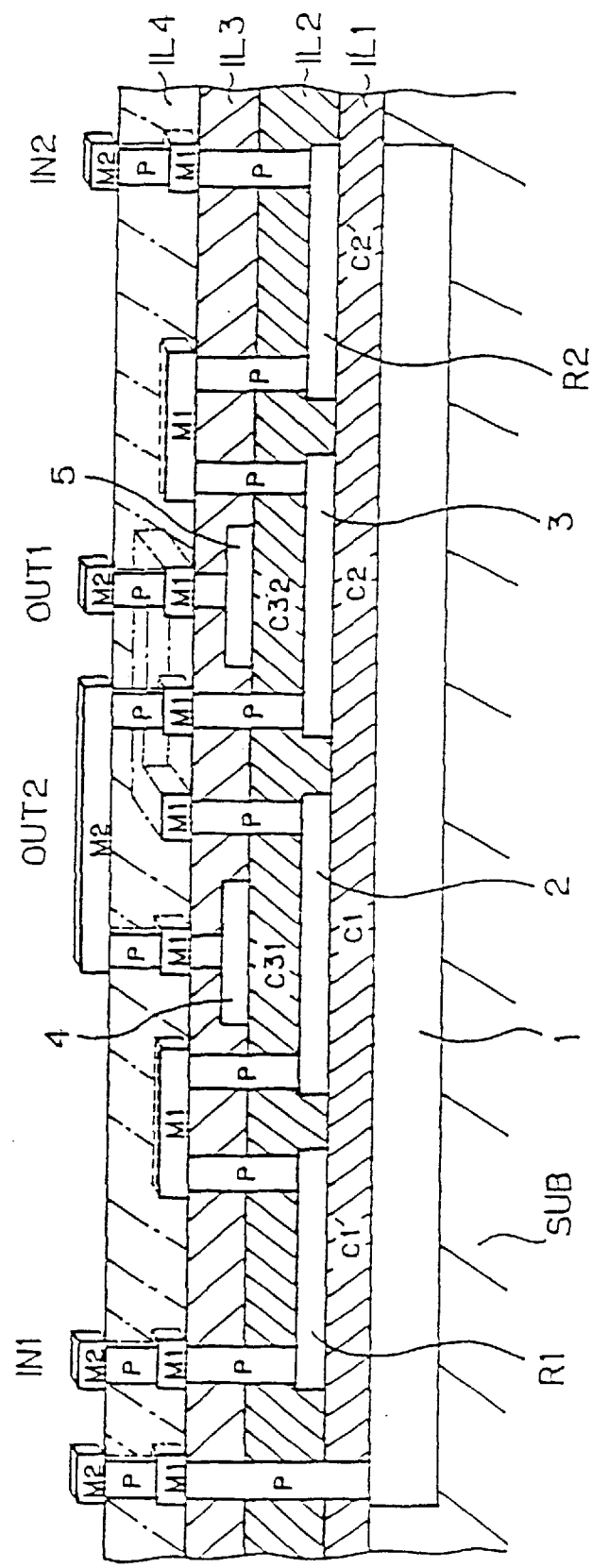
FIG. 7 is a cross-sectional view for explaining actual electrical connections in the integrated circuit structure depicted in FIG. 5.

FIG. 7 is a cross-sectional view illustrating actual electrical connecting means in the integrated circuit configuration depicted in FIG. 5. Referring specifically to FIG. 7, a third insulating layer IL3 is formed overlying the fourth electrode 4 and the fifth electrode 5, and on the third insulating layer IL3, conductors for providing electrical connections (so-called first metal and designated by the reference symbol M1 in FIG. 7) are appropriately formed at a plurality of locations. Further, a fourth insulating layer IL4 is formed overlying the conductors M1, and similar conductors (so-called second metal and designated by the reference symbol M2 in FIG. 7) are formed at appropriate locations on the fourth insulating layer I4. Conductive plugs (for example, plugs made of tungsten and designated by the reference symbol P) are utilized to provide electrical connections between the conductors M1 and the electrodes and resistors as well as between the respective conductors M1 and the corresponding conductors M2. For example, one end of the first electrode 1 is connected to a conductor M1 on the third insulating layer IL3 through a conductive plug P, and the conductor M1 in turn is connected to a conductor M2 on the fourth insulating layer IL4 through another conductive plug P. This conductor M2 is grounded or connected to a power supply. Also, adjacent ends of the first resistor R1 and the second electrode 2 is connected through a pair of conductive plugs P and a conductor M1 interconnecting the conductive plugs P. The remaining elements are likewise electrically connected as required, as illustrated in FIG. 7.

Figure 8:
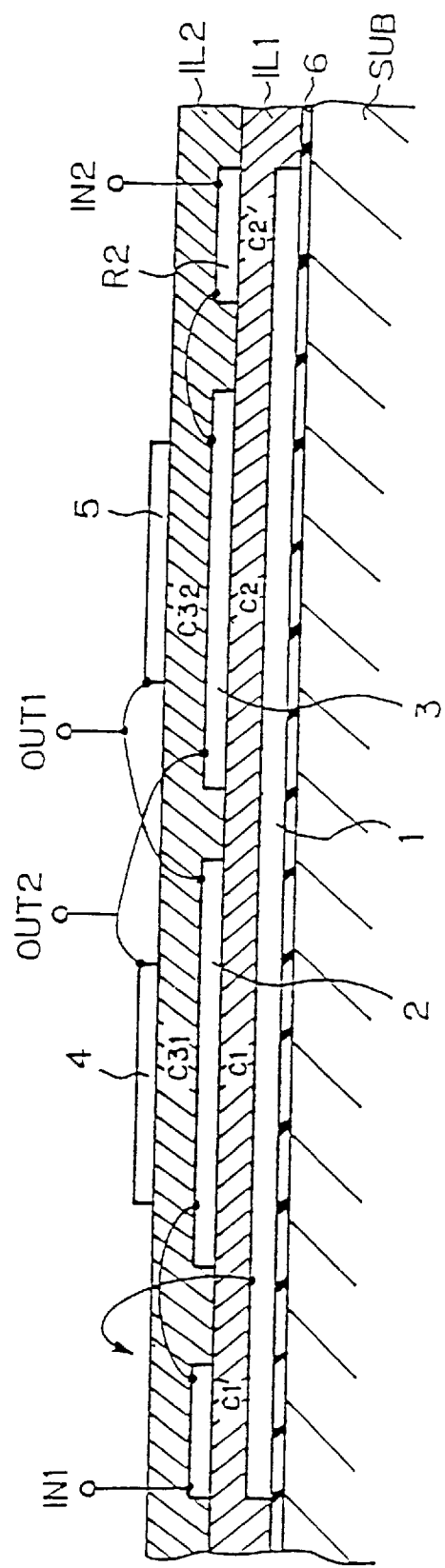
FIG. 8 is a cross-sectional view illustrating a modified example of the integrated circuit structure depicted in FIG. 5.

In the integrated circuit structure illustrated in FIG. 4, the N-type diffusion layer formed on the semiconductor SUB is used as the first electrode 1. Alternatively, the first electrode 1 may be formed of a conductive layer or a conductive thin film. FIG. 8 schematically illustrates this alternative structure. Referring specifically to FIG. 8, the first electrode 1 is a conductive layer formed overlying the semiconductor substrate SUB through an insulating film 6. This structure permits the first insulating layer IL1 to have a smaller thickness than in the integrated circuit structure of FIG. 4. This further results in a shorter distance between the first electrode 1 and the second electrode 2 and a shorter distance between the first electrode 1 and the third electrode 3, whereby the first capacitor C1 and the second capacitor C2 will have larger capacitance values. Thus, the freedom in designing the filter is advantageously increased.

While in the exemplary structure described above, the first resistor R1 and the second resistor R2 have been illustrated to be formed on the first insulating layer IL1 together with the second electrode 2 and the third electrode 3 and accordingly are made of the same conductive material as the second electrode 2 and the third electrode 3, the first resistor R1 and the second resistor R2 may be formed instead on the same surface on which the fourth electrode 4 and the fifth electrode 5 are formed. Also, after the second electrode 2 and the third electrode 3 are formed on the first insulating layer IL1, the second insulating layer IL2 may be formed in an overlying relationship with these electrodes 2, 3, and the first resistor R1 and the second resistor R2 may be formed on the first insulating layer IL1 which is not covered with the second insulating layer IL2. In these structures, the first resistor R1 and the second resistor R2 are made of the same conductive material as the fourth electrode 4 and the fifth electrode 5.

Figure 9:
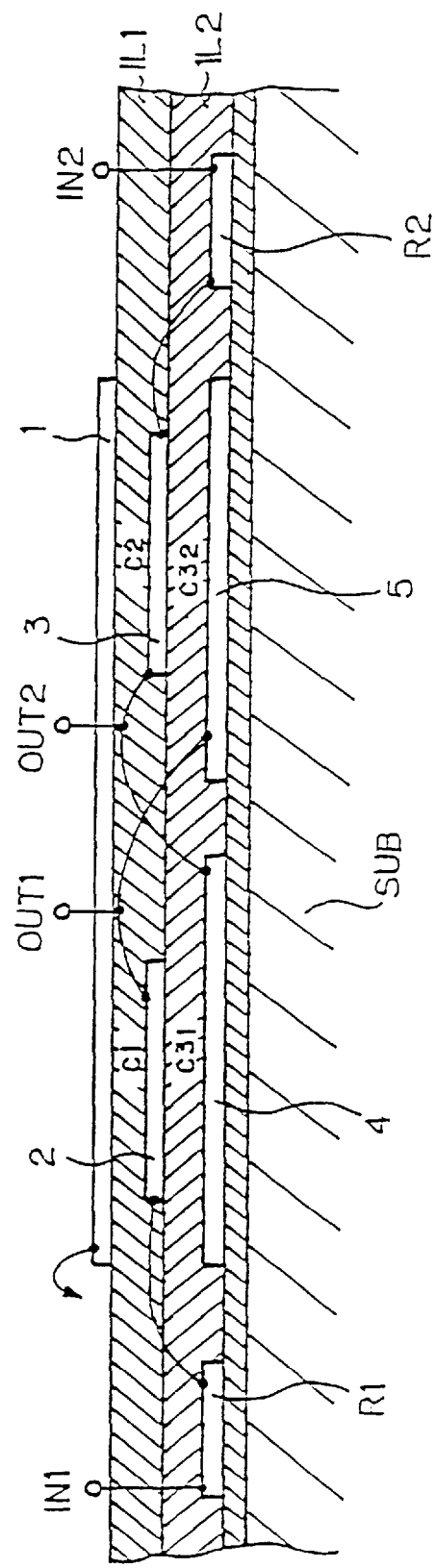
FIG. 9 is a cross-sectional view illustrating another modified example of the integrated circuit structure depicted in FIG. 4.

Also, in the exemplary structures described above, the first electrode 1 is a diffusion layer formed in the semiconductor substrate SUB or a conductive layer formed overlying the semiconductor substrate SUB through the insulating layer 6. Alternatively, the differential low pass filter structure may be implemented in an integrated circuit by the process reverse to that used to manufacture the integrated circuit structure illustrated in FIG. 4, wherein the first electrode 1 is first formed in the semiconductor substrate SUB and the fourth electrode 4 and the fifth electrode 5 are finally formed. Specifically, in the reverse manufacturing process, the fourth electrode 4 and the fifth electrode 5 are first formed overlying the semiconductor substrate SUB, and the first electrode 1 is finally formed on the top. FIG. 9 illustrates an integrated circuit structure formed by the process as mentioned above. Referring specifically to FIG. 9, the fourth electrode 4, the fifth electrode 5, the first resistor R1 and the second resistor R2 are formed overlying the semiconductor substrate SUB through the insulating film 6. Alternatively, the first resistor R1 and the second resistor R2 may be formed on the same surface on which the second electrode 2 and the third electrode 3 are formed, and the fourth electrode 4 and the fifth electrode 5 may be formed as an impurity diffusion layer in the semiconductor substrate SUB.

Figure 10:
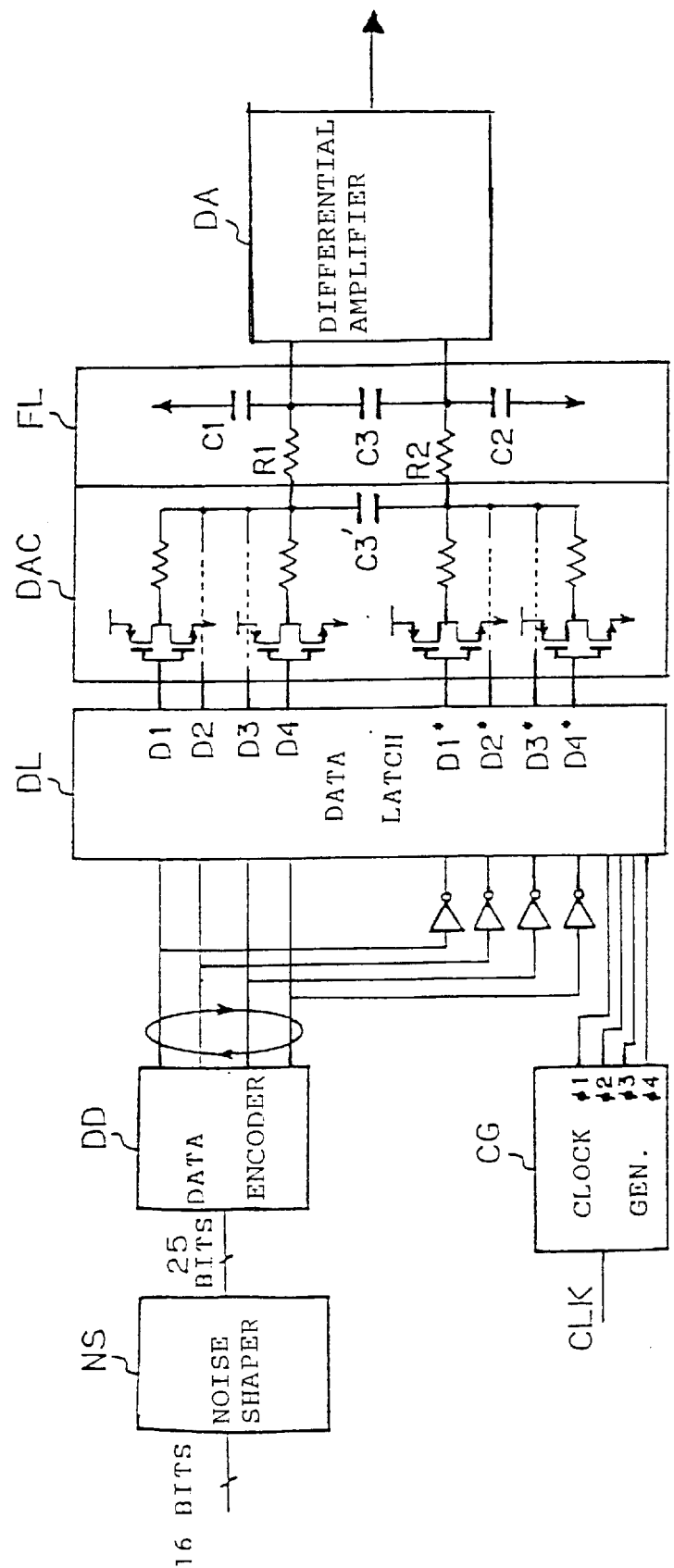
FIG. 10 is a circuit block diagram illustrating a multibit oversampling digital-to-analog convertor to which the differential low pass filter circuit depicted in FIG. 1 is applied.

FIG. 10 illustrates a circuit diagram of a multibit oversampling digital-to-analog convertor to which the differential low pass filter of FIG. 1 is applied. The multibit oversampling digital-to-analog convertor of FIG. 10 performs differential operations, wherein a digital output from a sigma-delta type third-order five-level noise shaping unit NS is inputted to a data encoder DD having a built-in bit rotation circuit for uniformly weighing a group of resistors. The outputs from the data encoder DD are temporarily stored in a data latch DL, for the purpose of adjusting conversion timing, together with inverted outputs produced by invertors for differential operations performed at later stages. The data latch DL is supplied with clock signals from a clock generator CG. The outputs of the data latch DL are supplied to the differential low pass filter FL of FIG. 1 through a digital-to-analog convertor DAC having a group of switches including a plurality of CMOS invertors, a group of conversion resistors and a capacitor C3'. The outputs of the low pass filter FL are supplied to a differential amplifier DA and outputted therefrom as an analog signal.

A low pass filter is also formed by the conversion resistor group of the digital-to-analog convertor DAC and the capacitor C3', so that this low pass filter, together with the low pass filter FL, constitutes a second-order low pass filter. Assuming that the respective low pass filters have, for example, a 6 dB/oct characteristic, the second-order low pass filter will have a 2 dB/oct characteristic. However, as a filter for removing a common-mode noise, the filter is in a first-order configuration.

If the multibit oversampling digital-to-analog convertor of FIG. 10 is used, for example, as an audio digital-to-analog convertor, noises within an audible frequency band (0–20 KHz) are reshaped by 48-times oversampling and pushed out of the bandwidth. Part of the noises pushed out of the bandwidth is removed by the low pass filter FL. Also, switching noises which are produced from the CMOS invertors forming a switch group when the conversion resistors in the digital-to-analog convertor DAC are switched cause the power supply itself of the CMOS invertors to produce common-mode noises. However, high frequency components of the common-mode noises are removed by the low pass filter FL.

Figure 11:
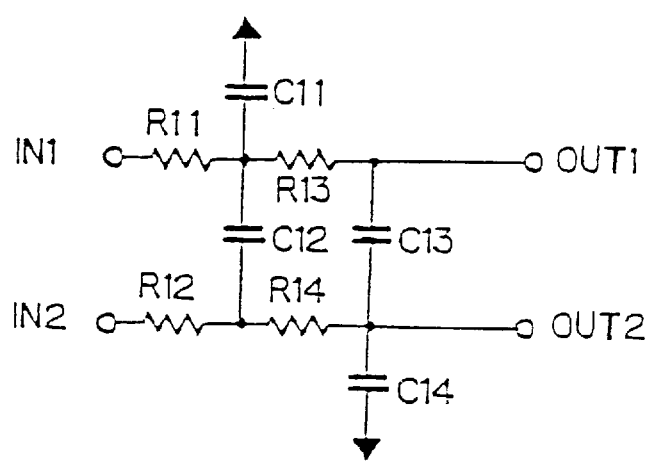
FIG. 11 is a schematic circuit diagram illustrating the configuration of a first-order differential low pass filter circuit, which is a second embodiment of a differential filter circuit according to the present invention.

The description made so far with reference to FIGS. 1–10 has been given in connection with a first-order differential low pass filter. Next, a second-order differential low pass filter, which is a second embodiment of a differential filter according to the present invention, will be described with reference to FIG. 11. Referring specifically to FIG. 11, a first input terminal IN1 is connected to one end of a first resistor R11, and a second input terminal IN2 is connected to one end of a second resistor R12. The other end of the first resistor R11 is grounded or connected to a power supply through a first capacitor C11, as well as is connected to the other end of the second resistor R12 through a second capacitor C12. Further, the other end of the first resistor R11 is connected to one end of a third resistor R13, and the other end of the second resistor R12 is connected to one end of a fourth resistor R14. The other end of the third resistor R13 is connected to a first output terminal OUT1 as well as is connected to the other end of the fourth resistor R14 through a third capacitor C13. The other end of the fourth resistor R14 is further connected to a second output terminal OUT2 as well as is grounded or connected to a power supply through a fourth capacitor C14.

The resistance of resistor R11 is equal to the resistance of resistor R12. The resistance of resistor R13 is equal to the resistance of resistor R14. The capacitance of capacitor C11 is equal to the capacitance of capacitor 14.

Figure 12:
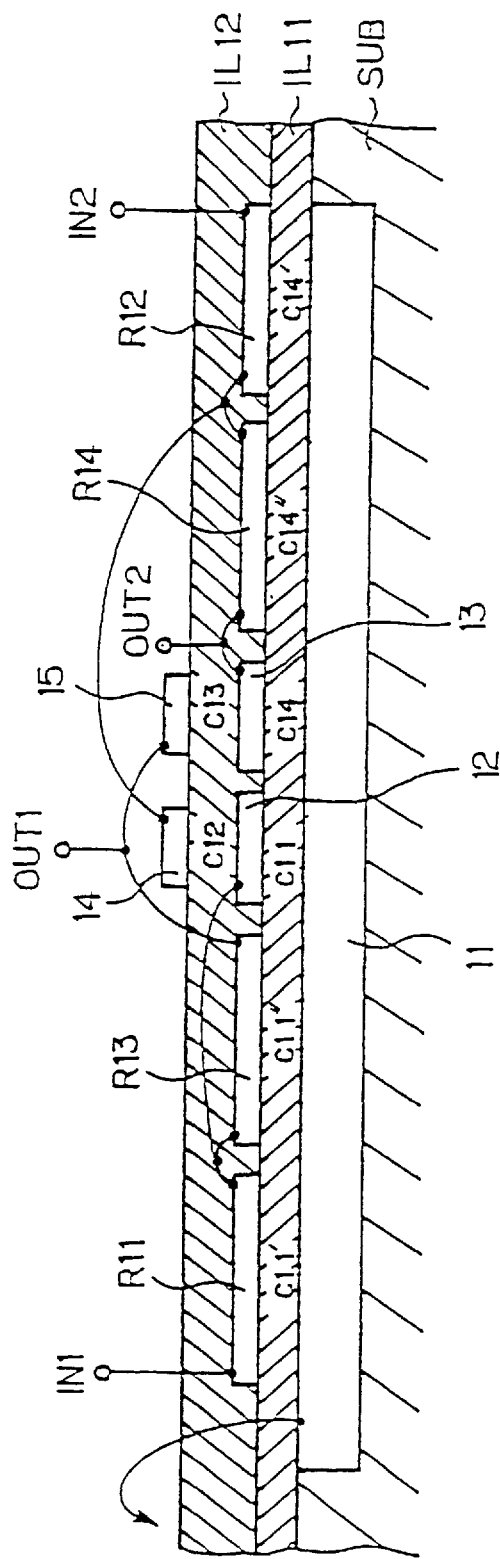
FIG. 12 is a cross-sectional view for explaining the integrated circuit structure constituting the differential low pass filter circuit of FIG. 11.

FIG. 12 is a cross-sectional view illustrating an example of an integrated circuit structure constituting the differential low pass filter of FIG. 11, wherein a first electrode 11 comprising an N-type diffusion layer is formed in a substrate SUB made of, for example, P-type silicon, and a first insulating layer IL11 is formed overlying the first electrode 11. On the first insulating layer IL1, a second electrode 12 and a third electrode 13 are formed at positions opposite to the first electrode 11. Also, a third resistor R13 and a fourth resistor R14 are formed outside these electrodes, and a first resistor R11 and a second resistor R12 are further formed outside the resistors R13, R14, respectively. It should be noted that while FIG. 12 illustrates that the first electrode 11 extends over an area such that the first–fourth resistors R11–R14 face therewith, the first electrode 11 is not necessarily formed as illustrated. Afterward, a second insulating layer IL12 is provided overlying the first–fourth resistors R11–R14 and the second and third electrodes 12, 13. Further, on the second insulating layer IL12, a fourth electrode 14 is formed at a position opposite to the second electrode 12, and a fifth electrode 15 is formed at a position opposite to the third electrode 13.

Thus, the first capacitor C1 is formed between the first electrode 11 and the second electrode 12; the second capacitor C12 is formed between the second electrode 12 and the fourth electrode 14; the third capacitor C13 is formed between the third electrode 13 and the fifth electrode 15; and the fourth capacitor C14 is formed between the third electrode 13 and the first electrode 11. Further, an additional capacitors C11' and C11" are formed between the first electrode 11 and the first resistor R11 and between the first electrode 11 and the third resistor R13, respectively, in parallel with the first capacitor C11, while additional capacitors C14', C14" are formed between the first electrode 11 and the second resistor R12 and between the first electrode 11 and the fourth resistor R14, respectively, in parallel with the first capacitor C11.

Figure 13:
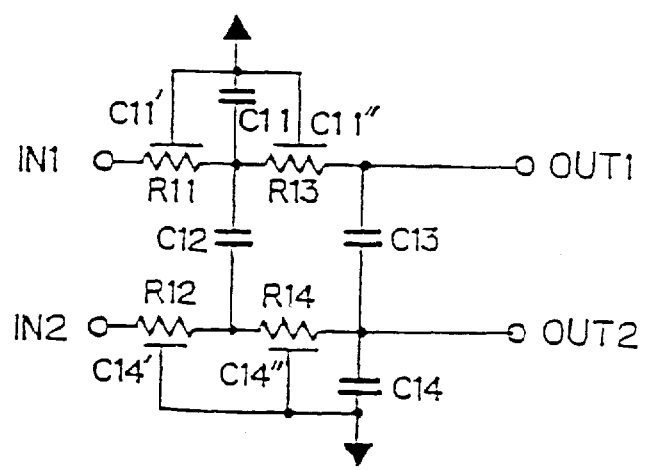
FIG. 13 is an equivalent circuit diagram for the integrated circuit structure depicted in FIG. 12.

These first to fifth electrodes 11–15, first to fourth resistors R11–R14, first input terminal IN1, second input terminal IN2, first output terminal OUT1 and second output terminal OUT2 are electrically connected to their associated elements through conductors as indicated by fat solid lines in FIG. 12. An equivalent circuit for the integrated circuit structure of FIG. 12 is represented in FIG. 13. As illustrated in FIG. 13, the capacitors C11', C11" connected in parallel with the first capacitor C11 and the capacitors C14', C14" connected in parallel with the fourth capacitor C14 perform the same functions as the capacitors C1', C2' , which have been described in connection with FIG. 6.

A solid line curve in FIG. 2 represents a characteristic of an overall low pass filter formed of a combination of the first resistor R11 and the first capacitor C1, a combination of the first resistor R11 and the capacitor C11', and a combination of the third resistor R13 and the capacitor C11".

Figure 14:
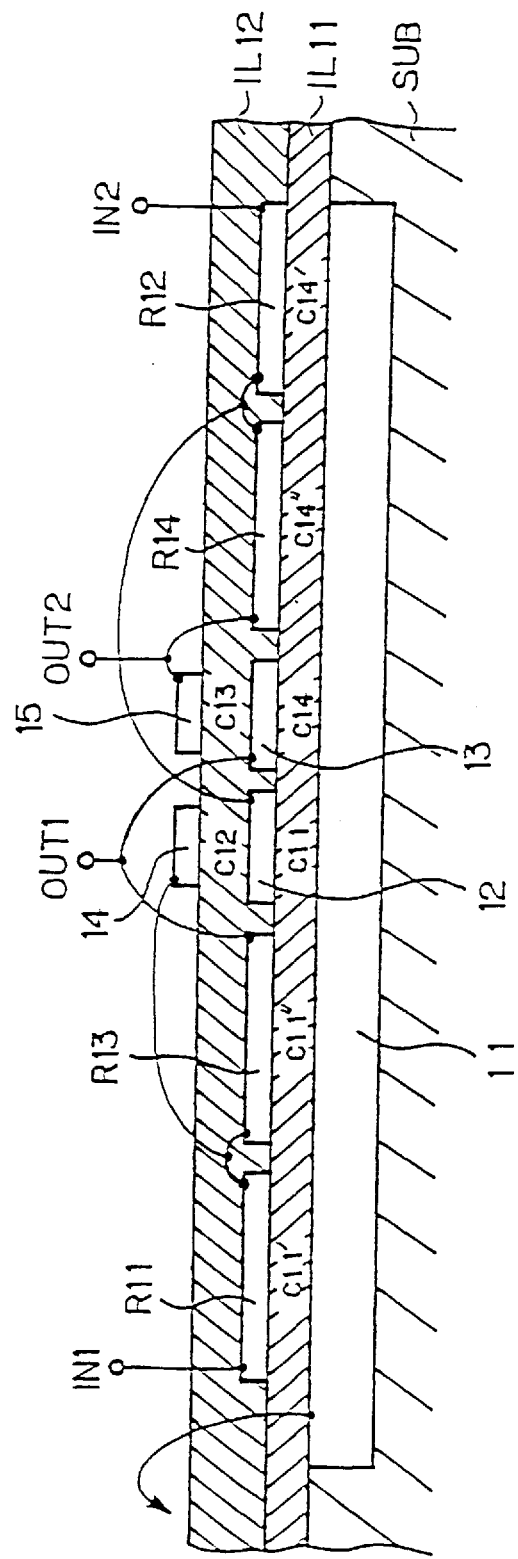
FIG. 14 is a cross-sectional view illustrating a modified example of the integrated circuit structure depicted in FIG. 12.
Figure 15:
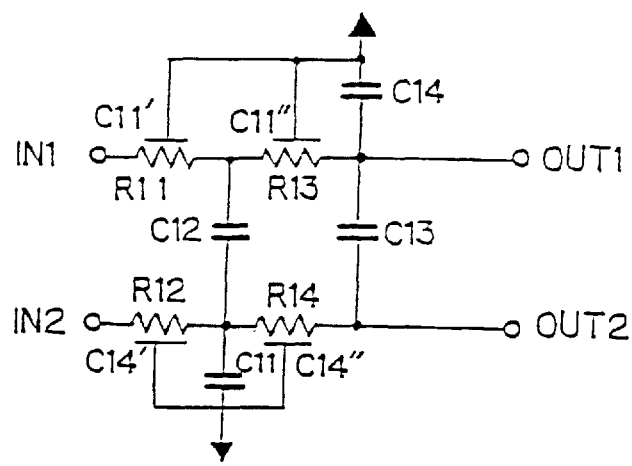
FIG. 15 is an equivalent circuit diagram for the integrated circuit structure depicted in FIG. 14.

Instead of the electrical connections illustrated in FIG. 12, adjacent ends of the first resistor R11 and the third resistor R13 may be connected to the fourth electrode 14; the remaining end of the third resistor R13 and the third electrode 13 to the first output terminal OUT1; the second electrode 12 to the adjacent ends of the fourth resistor R14 and the second resistor R12, respectively; and the remaining end of the fourth resistor R14 and the fifth electrode 15 to the output terminal OUT2, as illustrated in FIG. 14. An equivalent circuit for the circuit structure illustrated in FIG. 14 is represented in FIG. 15, where the first capacitor C11 is connected to a junction point between the second resistor R12 and the fourth resistor R14, and the capacitors C14', C14" are connected in parallel with the first capacitor C11. Also, the fourth capacitor C14 is connected between the first output terminal OUT1 and a reference potential, while the capacitors C11', C11" are connected in parallel with the fourth capacitor C14.

In the integrated circuit structures illustrated in FIGS. 12 and 14, the first electrode 11 may also be formed by a layer which is formed by diffusing, in the semiconductor substrate SUB, an impurity of a conductive type different from that of the semiconductor substrate, or may be formed by a conductive film or a conductive layer overlying the semiconductor substrate SUB through an insulating film, similarly to the first embodiment. Also, the integrated circuit structures illustrated in FIGS. 12 and 14 may be manufactured by a similar process to that described in connection with the integrated circuit structure of FIG. 9 where the fourth electrode 14 and the fifth electrode 15 are first formed on the semiconductor substrate SUB and the first electrode 11 is finally formed.

Further, the insulating layers, the electrodes and the resistors in the second embodiments may be formed by the same materials in the same thicknesses as those specifically presented in the first embodiment. However, it is to be understood that the present invention is not limited to such specific materials and thicknesses.

Figure 16:
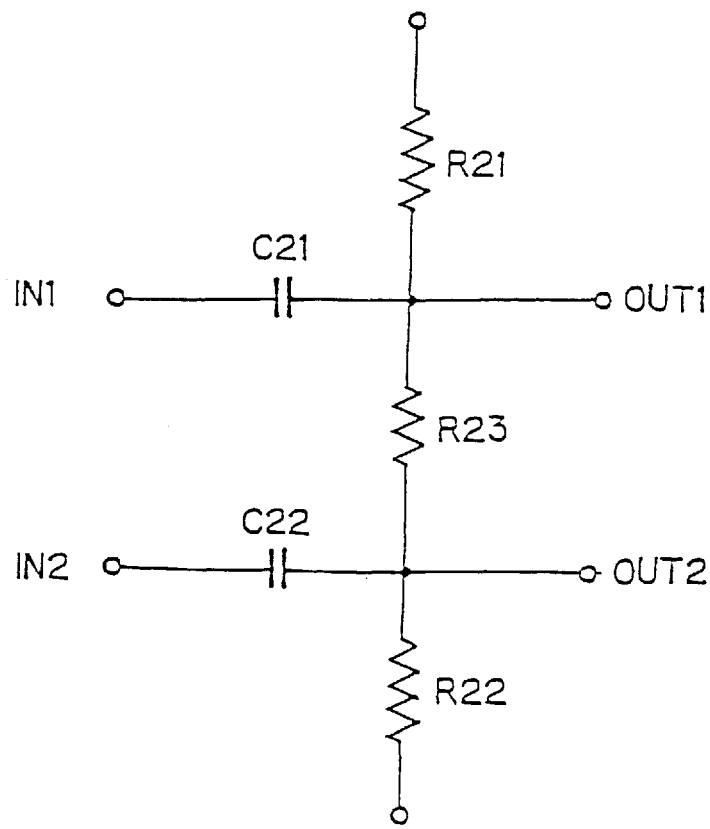
FIG. 16 is a schematic circuit diagram illustrating the configuration of a first-order differential low pass filter circuit, which is a third embodiment of a differential filter circuit according to the present invention.

While the foregoing description has been made in connection with first-order and second-order differential low pass filters, a differential high pass filter may also be formed by replacing resistors with capacitors and capacitors with resistors. FIG. 16 schematically illustrates the configuration of a first-order differential high pass filter, which is a third embodiment of a differential filter circuit according to the present invention. Referring specifically to FIG. 16, a first capacitor C21 is connected between a first input terminal IN1 and a first output terminal OUT1, and a second capacitor C22 is connected between a second input terminal IN2 and a second output terminal OUT2. The first output terminal OUT1 is grounded or connected to a power supply through a first resistor R21. The second output terminal OUT2 is grounded or connected to a power supply through a second resistor R22. A third resistor R23 is connected between the first output terminal OUT1 and the second output terminal OUT2.

As is apparent from the foregoing detailed description of the present invention with reference to several embodiments thereof, the differential low pass filter circuit according to the present invention is capable of removing both normal-mode and common-mode noises. Also, when the differential low pass filter circuit of the present invention is implemented in an integrated circuit, electrodes constituting a capacitor for a normal filtering function and a capacitor for removing a common-mode noise can be shared, so that such a filter can be formed in a smaller area. The differential high pass filter according to the present invention is also capable of removing both normal-mode and common-mode noises.

The invention has been described in detail with particular reference to certain preferred embodiments thereof, but it will be understood that variations and modifications can be effected within the spirit and scope of the invention.

What is claimed is:

1. A first-order differential low pass filter circuit comprising:
   a first resistor exclusively connected between a first input terminal and a first output terminal;
   a second resistor having the same resistance value as said first resistor and exclusively connected between a second input terminal and a second output terminal;
   a first capacitor connected between said first output terminal and a reference potential;
   a second capacitor having the same capacitance value as said first capacitor and connected between said second output terminal and said reference potential; and
   a third capacitor connected between said first output terminal and said second output terminal.

2. An integrated circuit structure comprising:
   a first insulating layer;
   a first electrode formed to be in contact with a first surface of said first insulating layer;
   a second electrode and a third electrode formed on an opposite second surface of said first insulating layer at positions opposite to said first electrode;
   a fourth electrode and a fifth electrode formed at positions opposite to said second electrode and said third electrode, respectively, through a second insulating layer;
   a first resistor and a second resistor formed on the second surface of said first insulating layer;
   a first conductor for connecting said first electrode to a reference potential;
   a second conductor for connecting a first end of said first resistor to said second electrode;
   a third conductor for connecting a first end of said second resistor to said third electrode;
   a fourth conductor for connecting said second electrode to said fifth electrode;
   a fifth conductor for connecting said third electrode to said fourth electrode;
   a first input terminal connected to a second end of said first resistor and a second input terminal connected to a second end of said second resistor, respectively; and
   first and second output terminals connected to said fourth electrode and said fifth electrode, respectively,
   wherein said first electrode and said second electrode form a first capacitor, said first electrode and said third electrode form a second capacitor, said second electrode and said fourth electrode form one capacitor constituting a third capacitor, and said third electrode and said fifth electrode form another capacitor constituting said third capacitor, said first and second resistors and said first, second and third capacitors constituting a first-order differential low pass filter.

3. The integrated circuit structure according to claim 2, wherein said first electrode comprises a layer formed by diffusing, in a semiconductor substrate, an impurity of a conduction type different from that of said semiconductor substrate.

4. The integrated circuit structure according to claim 2, wherein said first resistor and said second resistor are formed on the second surface of said first insulating layer and wherein said first electrode is formed in said semiconductor substrate such that a first additional capacitor is formed between said first electrode and said first resistor and that a second additional capacitor is formed between said first electrode and said second resistor.

5. The integrated circuit structure according to claim 2, wherein each of said fourth electrode and said fifth electrode comprises a layer formed on an insulating layer on said semiconductor substrate through.

6. The integrated circuit structure according to claim 2, wherein said first electrode and said second electrode are of the same material as said first to fifth electrodes.

7. A second-order differential low pass filter comprising:
   a first resistor connected between a first input terminal and a first junction point, and a second resistor and connected between the first junction point and a first output terminal;
   a third resistor having the same resistance value as said first resistor and connected between a second input terminal and a second junction point, and a fourth resistor having the same resistance value as said third resistor and connected between the second junction point and a second output terminal;
   a first capacitor connected between the first junction point and a reference potential;
   a second capacitor connected between the first junction point and the second junction point;
   a third capacitor connected between said first output terminal and said second output terminal; and
   a fourth capacitor connected between said second output terminal and said reference potential, said fourth capacitor having the same capacitance value as said first capacitor.

8. An integrated circuit structure comprising:
   a first insulating layer;
   a first electrode formed to be in contact with a first surface of said first insulating layer;
   a second electrode and a third electrode formed on opposite second surface of said first insulating layer at positions opposite to said first electrode;
   a fourth electrode and a fifth electrode formed at positions opposite to said second electrode and said third electrode, respectively, on a second insulating layer covering said second and third electrodes;
   a first resistor, a second resistor, a third resistor and a fourth resistor formed on the first surface;
   a first conductor for connecting said first electrode to a reference potential;
   a second conductor for connecting a first end of said first resistor to a first end of said third resistor and to said second electrode;
   a third conductor for connecting a first end of said second resistor to a first end of said fourth resistor and to said fourth electrode;
   a fourth conductor for connecting a second end of said third resistor to said fifth electrode;
   a fifth conductor for connecting a second end of said fourth resistor to said third electrode;
   a first input terminal connected to a second end of said first resistor and a second input level connected to a second end of said second resistor; and a first output terminal connected to said third electrode and to said fifth electrode, respectively;

wherein said first electrode and said second electrode form a first capacitor, said second electrode and said fourth electrode form a second capacitor, said third electrode and said fifth electrode form a third capacitor and said first electrode and said third electrode form a fourth capacitor, said first, second, third, and fourth resistors and said first, second, third, and fourth capacitors constituting a second-order differential low pass filter.

9. The integrated circuit structure according to claim 8, wherein said first electrode comprises a layer formed by diffusing, in said semiconductor substrate, an impurity of a conduction type different from that of said semiconductor substrate.

10. The integrated circuit structure according to claim 8, wherein said first resistor to said fourth resistor are formed on the second surface of said first insulating layer and wherein said first electrode is formed in a positional relationship with said semiconductor substrate such that a first additional capacitor is formed between said first electrode and said first resistor, a second additional capacitor is formed between said first electrode and said third resistor, a third additional capacitor is formed between said first electrode and said second resistor, and a fourth additional capacitor is formed between said first electrode and said fourth resistor.

11. The integrated circuit structure according to claim 8, wherein each of said fourth electrode and said fifth electrode comprises a layer formed on an insulating layer said semiconductor substrate.

12. The integrated circuit structure according to claim 8, wherein said first resistor to said fourth resistor are made of the same material as said first to fifth electrodes.

13. An integrated circuit structure comprising:

a first insulating layer;

a first electrode formed to be in contact with a first surface of said first insulating layer;

a second electrode and a third electrode formed on an opposite second surface of said first insulating layer at positions opposite to said first electrode;

a fourth electrode and a fifth electrode formed at positions opposite to said second electrode and said third electrode, respectively, on a second insulating layer;

a first resistor, a second resistor, a third resistor and a fourth resistor formed on the second surface of said first insulating layer;

a first conductor for connecting said first electrode to a reference potential;

a second conductor for connecting a first end of said first resistor to a first end of said third resistor and to said fourth electrode;

a third conductor for connecting a first end of said second resistor to a first end of said fourth resistor and to said second electrode;

a fourth conductor for connecting a second end of said third resistor to said third electrode;

a fifth conductor for connecting the other end of said fourth resistor to said fifth electrode;

a first input terminal connected to a second end of said first resistor and a second input terminal connected to a second end of said second resistor, respectively, and first and second output terminals connected to said third electrode and said fifth electrode, respectively;

wherein said first electrode and said second electrode form a first capacitor, said second electrode and said fourth electrode form a second capacitor, said third electrode and said fifth electrode form a third capacitor and said first electrode and said third electrode form a fourth capacitor, said first, second, third, and fourth resistors and said first, second, third, and fourth capacitors constituting a second-order differential low pass filter.

14. The integrated circuit structure according to claim 13, wherein said first electrode comprises a layer formed by diffusing, in said semiconductor substrate, an impurity of a conduction type different from said semiconductor substrate.

15. The integrated circuit structure according to claim 13, wherein said first resistor to said fourth resistor are formed on the second surface of said first insulating layer and wherein said first electrode is formed in a positional relationship with said semiconductor substrate such that a first additional capacitor is formed between said first electrode and said first resistor, a second additional capacitor is formed between said first electrode and said third resistor, a third additional capacitor is formed between said first electrode and said second resistor and a fourth additional capacitor is formed between said first electrode and said fourth resistor.

16. The integrated circuit structure according to claim 13, wherein each of said fourth electrode and said fifth electrode comprises a layer formed on an insulating layer said semiconductor substrate.

17. The integrated circuit structure according to claim 13, wherein said first resistor to said fourth resistor are made of the same material as said first to fifth electrodes.

18. A differential high pass filter comprising:

a first capacitor connected between a first input terminal and a first output terminal;

a second capacitor having the same capacitance value as said first capacitor and connected between a second input terminal and a second output terminal;

a first resistor connected between said first output terminal and a reference potential;

a second resistor having the same resistance value as said first resistor and connected between said second output terminal and said reference potential; and a third resistor connected between said first output terminal and said second output terminal.

* * * * *